United States Patent [19]
Durham et al.

[11] Patent Number: 5,565,798
[45] Date of Patent: Oct. 15, 1996

[54] SELF-TIMED CONTROL CIRCUIT FOR SELF-RESETTING LOGIC CIRCUITRY

[75] Inventors: Christopher M. Durham; Peter J. Klim, both of Austin, Tex.

[73] Assignee: International Business Machines Corporation, Armonk, N.Y.

[21] Appl. No.: 517,224

[22] Filed: Aug. 21, 1995

[51] Int. Cl.[6] .................................................. H03K 19/00
[52] U.S. Cl. ................................ 326/93; 326/17; 326/21; 326/40
[58] Field of Search .............................. 326/93–98, 21, 326/40, 17; 327/198, 208, 210–212; 377/77, 78, 81

[56] References Cited

U.S. PATENT DOCUMENTS

| | | | |
|---|---|---|---|
| 4,717,912 | 1/1988 | Harvey | 326/39 |
| 4,985,643 | 1/1991 | Proebsting | 326/17 |
| 5,329,176 | 7/1994 | Miller, Jr. | 326/95 |
| 5,373,204 | 12/1994 | Muramatsu | 326/21 |
| 5,434,519 | 7/1995 | Trinh et al. . | |
| 5,450,020 | 9/1995 | Jones | 326/46 |
| 5,493,239 | 2/1996 | Zlotnick | 326/40 |

OTHER PUBLICATIONS

United States Patent Application Serial No. 08/450,056.
United States Patent Application Serial No. 08/461,961.

*Primary Examiner*—Edward P. Westin
*Assistant Examiner*—Andrew Sanders
*Attorney, Agent, or Firm*—Kelly K. Kordzik; Winstead Sechrest & Minick P.C.; Mark E. McBurney

[57] ABSTRACT

A self-timed control circuit for self-resetting CMOS logic circuitry provides handshaking between macros to ensure that all data inputted to a particular macro is maintained by the source macros until all data inputs have been received. A data output signal from a macro is maintained until the macro receives a complete signal from all receiving macros indicating that the receiving macros have received all data inputs supplied to them.

9 Claims, 8 Drawing Sheets

| FIG. 5A | FIG. 5B |

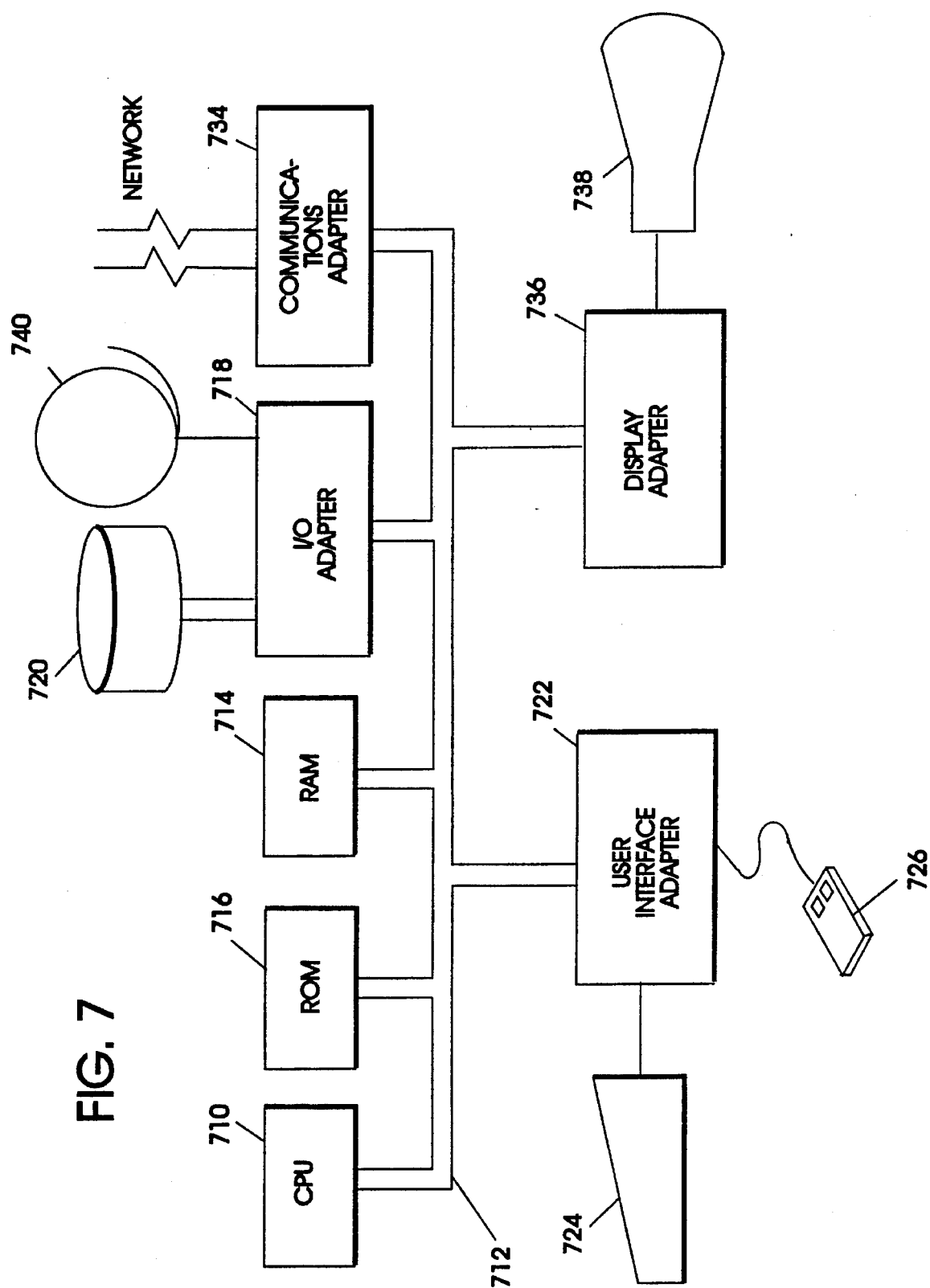

5,565,798

SELF-TIMED CONTROL CIRCUIT FOR SELF-RESETTING LOGIC CIRCUITRY

TECHNICAL FIELD OF THE INVENTION

The present invention relates in general to data processing systems, and more particularly, to a control circuit that allows self-resetting logic circuitry to be self-timing.

BACKGROUND OF THE INVENTION

Self-resetting logic circuitry was partly designed to eliminate the need to utilize a system clock signal in order to properly time all logic operations within very large scale integrated (VLSI) circuitry. Such self-resetting logic circuitry has generally been implemented with CMOS technology. Self-resetting CMOS ("SRCMOS") circuitry has been the subject of several patents and pending patent applications assigned to the assignee of this invention. For further background on SRCMOS design circuitry, please refer to U.S. Pat. No. 5,434,519 and U.S. patent applications Ser. Nos. (AA9-95-064), 08/450,056, and 08/461,961, which are hereby incorporated by reference herein.

SRCMOS design suffers from the increased complexity of uncertain signal arrival and pulse widths. This problem is manageable under limited conditions where all signal interfaces are well-behaved, such as internal to a single macro or unit, e.g., adder, SRAM, etc. However, when SRCMOS is applied across a large design, such as a microprocessor, the design environment is greatly complicated by noise, voltage differences (Vdd/ground bounce), inherent process variations, variability of inter-macro/unit wiring, etc. This results in a nearly intractable problem for interfacing SRCMOS circuitry across an entire chip design.

Referring to FIG. 1, there is illustrated a typical arrangement of macros, which are implemented within an SRCMOS design, and may be utilized within some computing element in a microprocessor, such as a floating point multiplier. Note, macros 101, 102 and 103 each receive N data inputs from various sources. Macros 101–103 perform a logical operation on these data inputs to produce data outputs which are supplied to various ones of macros 104–108. The coupling of macros 101–108 illustrated in FIG. 1 is merely an example of the complexity utilized within SRCMOS designed logic circuitry.

Referring to FIG. 2, there is illustrated a typical pipeline of dynamic, or domino, logic circuitry implemented in a SRCMOS design. The circuitry illustrated in FIG. 2 may represent macro 107 within an overall VLSI circuit within a computing element in a microprocessor.

Macro 107 receives input pulses and produces (usually) output pulses. Internally, the circuitry is comprised of rows of domino logic, reset by internally generated reset pulses by control circuit 201, which in this design monitors input signals $input_1$, $input_2$ and $input_3$, which are received by a pulse generator within control circuit 201, which outputs a signal that is supplied to each row of domino logic as reset signals $reset_1 \ldots reset_n$, which are typically timed for entry into each row of domino logic by delay elements within control circuit 201 (the delay elements are represented as inverters in FIG. 2).

Timing hazards arise in this circuit approach when the input pulses begin to skew due to process variations, voltage variations, etc. That is, SRCMOS circuits rely on the input pulses ($input_1$, $input_2$ and $input_3$) to overlap by some amount in order that they may be properly evaluated by macro 107.

For example, if the input pulses do not overlap in some manner, the reset signal $reset_1$ may be generated before the first row of domino logic has received all of the input signals for evaluation.

Since macro 107 is completely uncoupled from its input sources (macros 104–106) except for these input pulses, it must be designed to handle any on-chip variation conditions that may arise. This leads to a small design space, which may change significantly late in the design project because of logic changes, power implications that change voltage, etc.

Likewise, the outputs of macros 101–108 are completely uncoupled to their sinks. This means that the output pulse generated by each macro has no interaction with its receiving macro, which must be able to coordinate all such pulses from all relevant sources. This also creates an extremely small and tricky design space.

The net effect of the macro-to-macro interaction problem is one of pulse interaction. If a macro misses a pulse (for whatever reason) it will produce wrong results. That is, a functional failure will be created and this pulse miss may not be diagnosable because it may either be nearly impossible to repeat or too difficult to characterize.

Note, however, that the internal operation of macro 107 is well behaved and isolated once the inputs have been received. That is, the internal reset pulses ($reset_1 \ldots reset_n$) are quite easily controlled because of the locality of the design problem, i.e., the design space is localized to the circuitry in question. FIG. 3 illustrates a timing diagram of the various signals produced within macro 107 and illustrating how the reset pulses are properly timed for resetting each row of domino logic circuitry when the input pulses $input_1$, $input_2$ and $input_3$ overlap.

Therefore, the SRCMOS nature of the internal portion of the circuitry is fine. However, the handshaking of inputs and outputs to/from each macro within an SRCMOS design is inherently prone to producing errors due to various factors, some of which have been described above. Therefore, there is a need in the art for a handshaking technique that allows for variations in the timing of received input pulses to a macro so that the macro may properly evaluate the input signals and produce an output signal that is error free.

SUMMARY OF THE INVENTION

The foregoing need is satisfied by the present invention which utilizes a self-timed interface circuit designed to alleviate pulse interaction problems between macros. This circuit may be embodied within a near plug-in component into a SRCMOS design and guarantees the macro-to-macro interaction will function.

The present invention requires that all source macros supplying inputs to a particular macro hold their inputs until the receiving macro signals to the source macros that it has received all of the inputs. Likewise, each macro will hold its input until it receives this signal from the receiving macro, and will thus not reset the last row of domino logic until that complete signal has been received. This forces a valid output to remain active until all sinks have returned a completion, meaning that they have received and acted upon this data.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWING

For a more complete understanding of the present invention, and the advantages thereof, reference is now made to the following descriptions taken in conjunction with the accompanying drawings, in which:

FIG. 7 illustrates a data processing system configured in accordance with the present invention.

DETAILED DESCRIPTION OF A PREFERRED EMBODIMENT OF THE INVENTION

Figure 1:
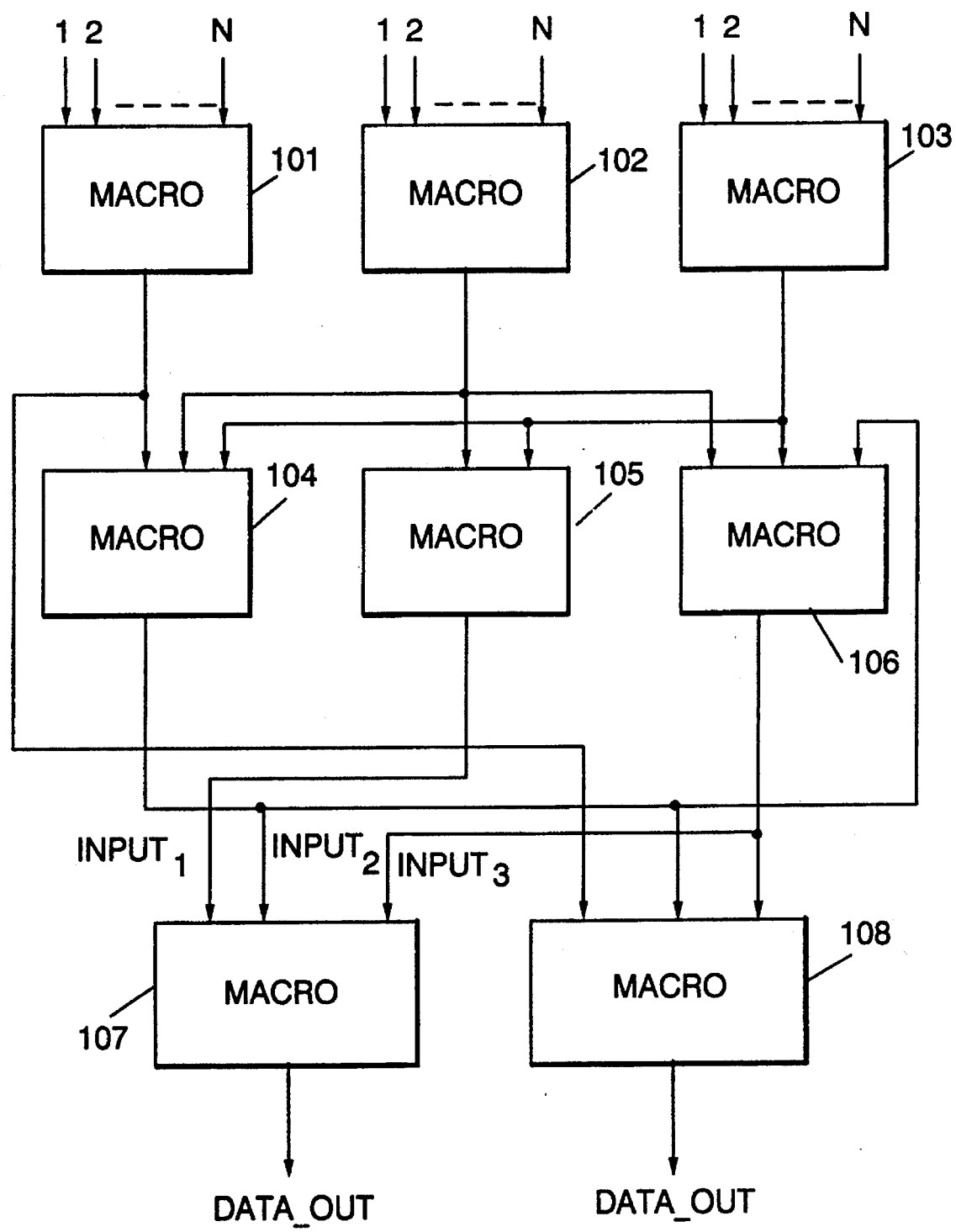
FIG. 1 illustrates a prior art arrangement of macros implemented in a SRCMOS design.
Figure 2:
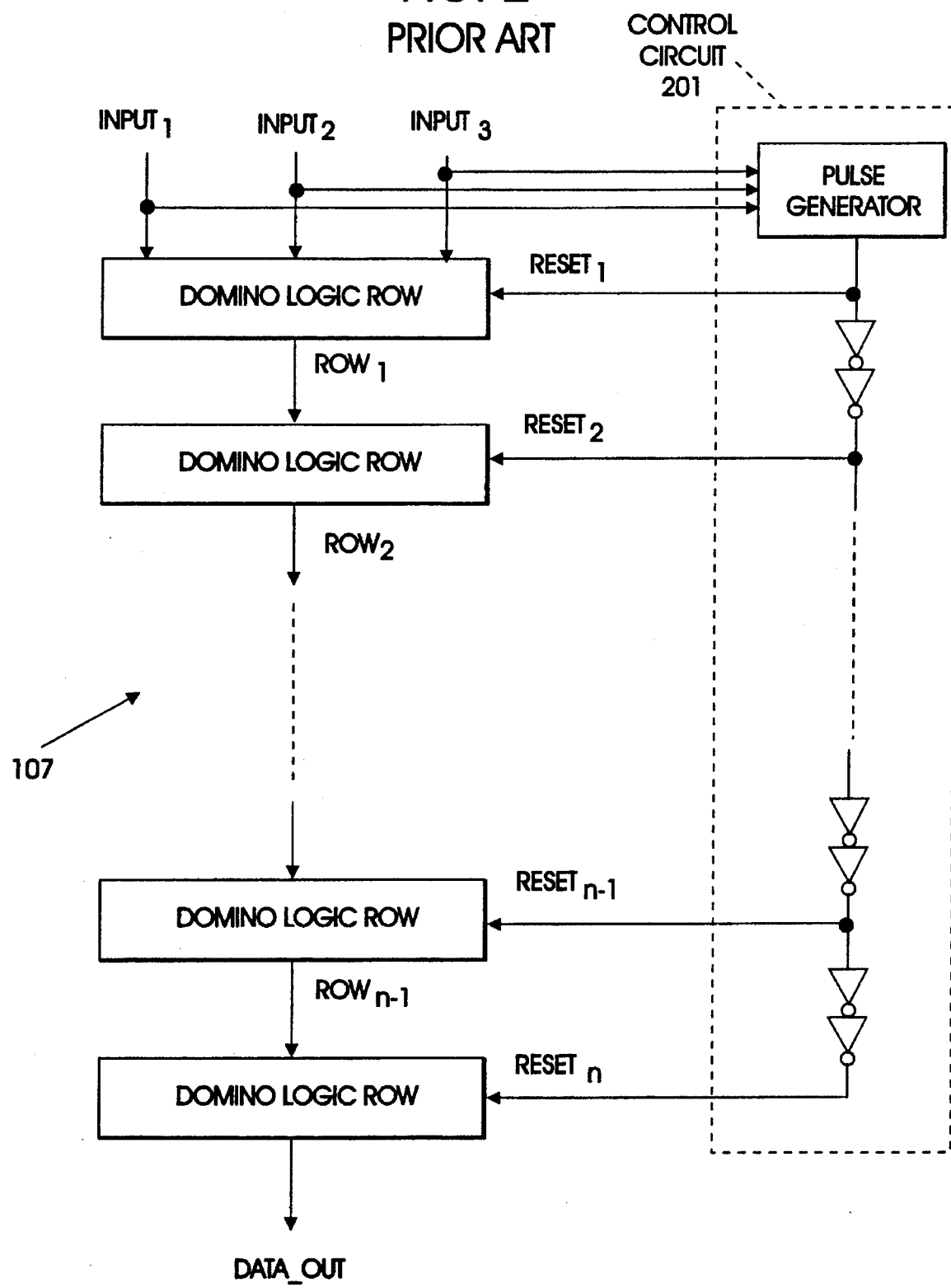
FIG. 2 illustrates a more detailed diagram of one of the macros of FIG. 1.
Figure 3:
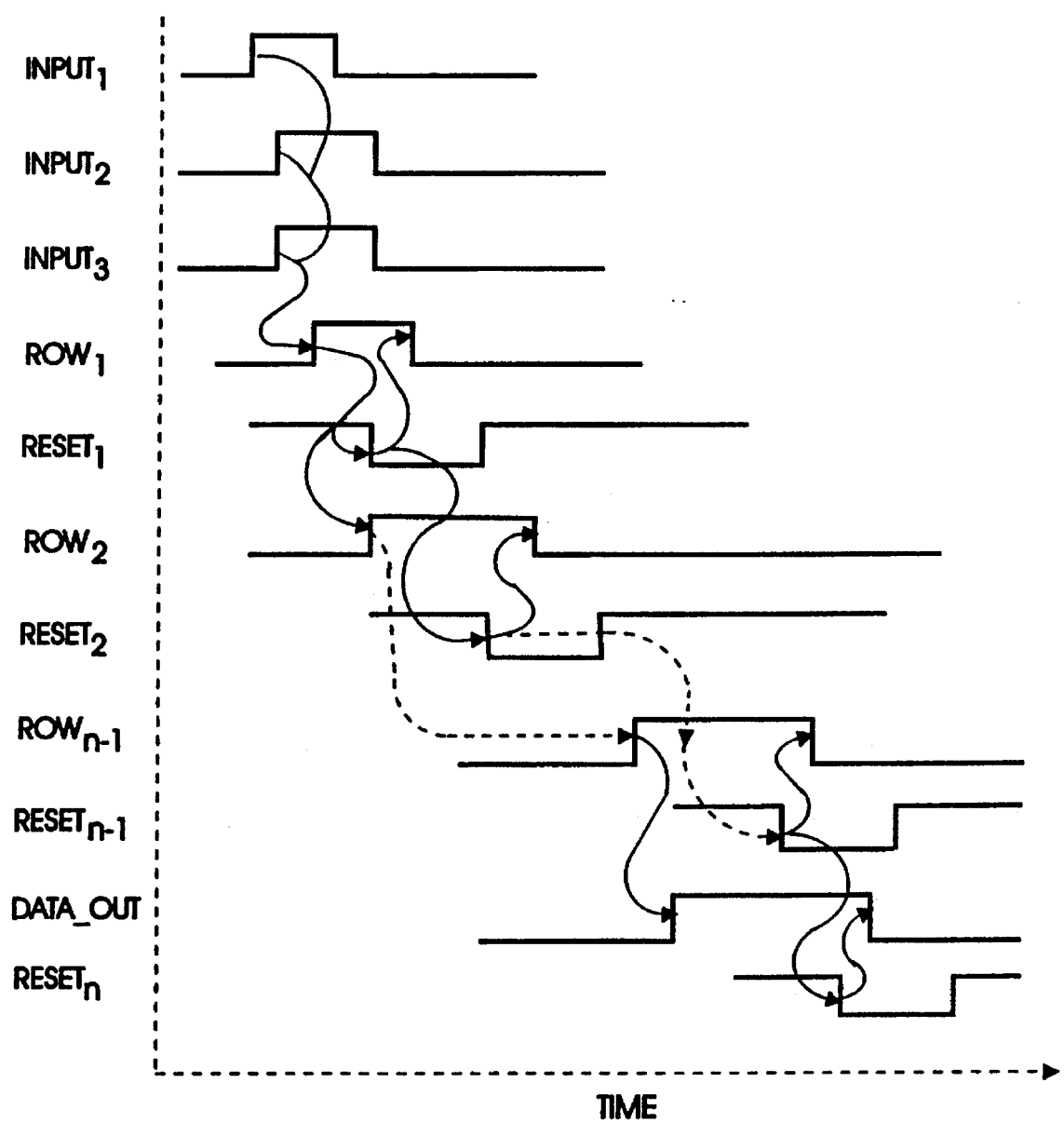
FIG. 3 illustrates a timing diagram of the flow of operation within the macro illustrated in FIG. 2.

In the following description, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 4:
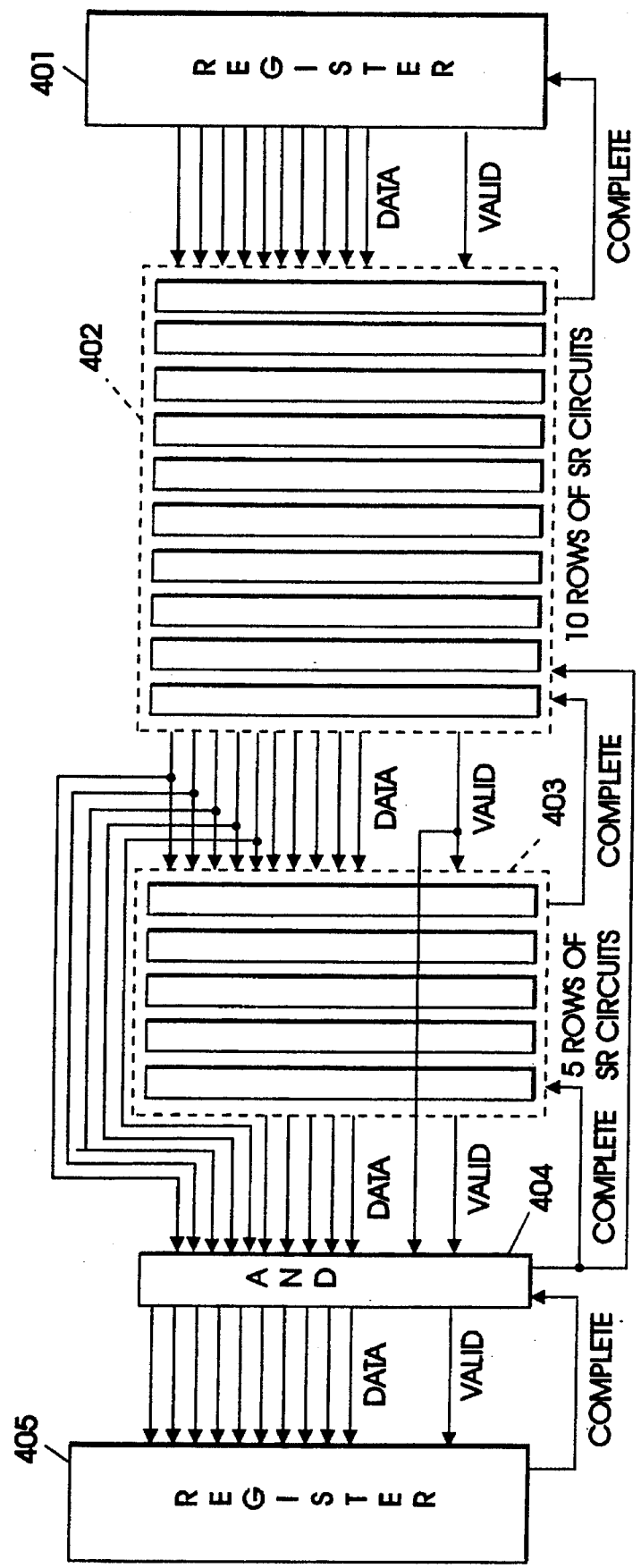
FIG. 4 illustrates an SRCMOS design of logic circuitry in accordance with the present invention.

Referring to FIG. 4, there is illustrated a utilization of the present invention within an example arrangement of pipelined logic circuitry implemented in an SRCMOS design. Note, however, an embodiment of the handshaking protocol of the present invention could be implemented within logic circuitry other than self-resetting CMOS.

Data from register 401 is received by macro 402, which in this embodiment includes 10 rows of self-resetting domino logic. The data may be received from several independent sources into register 401 for subsequent passage into macro 402. Such sources could be independent macros similar to those illustrated in FIG. 7. Discussions below with respect to FIGS. 5 and 6 will refer to macro 402 having n (wherein n is an integer greater than zero) stages of domino logic.

Macro 402 receives the incoming data and produces output data that is transmitted to both macros 403 and AND circuit 404. AND circuit 404 also receives data processed by macro 403. The results of AND circuit 404 are transmitted to register 405. The example shown in FIG. 4 is for illustration purposes only. The present invention may be embodied within any arrangement of logic circuitry in the manner set forth herein.

The VALID and COMPLETE signals shown in FIG. 4 will be discussed in further detail below with respect to FIGS. 5 and 6.

The macros in FIG. 1 could also be modified in accordance with the present invention. Thus, within the following discussion, macro 402 could be replaced with macro 107.

Figure 5A:
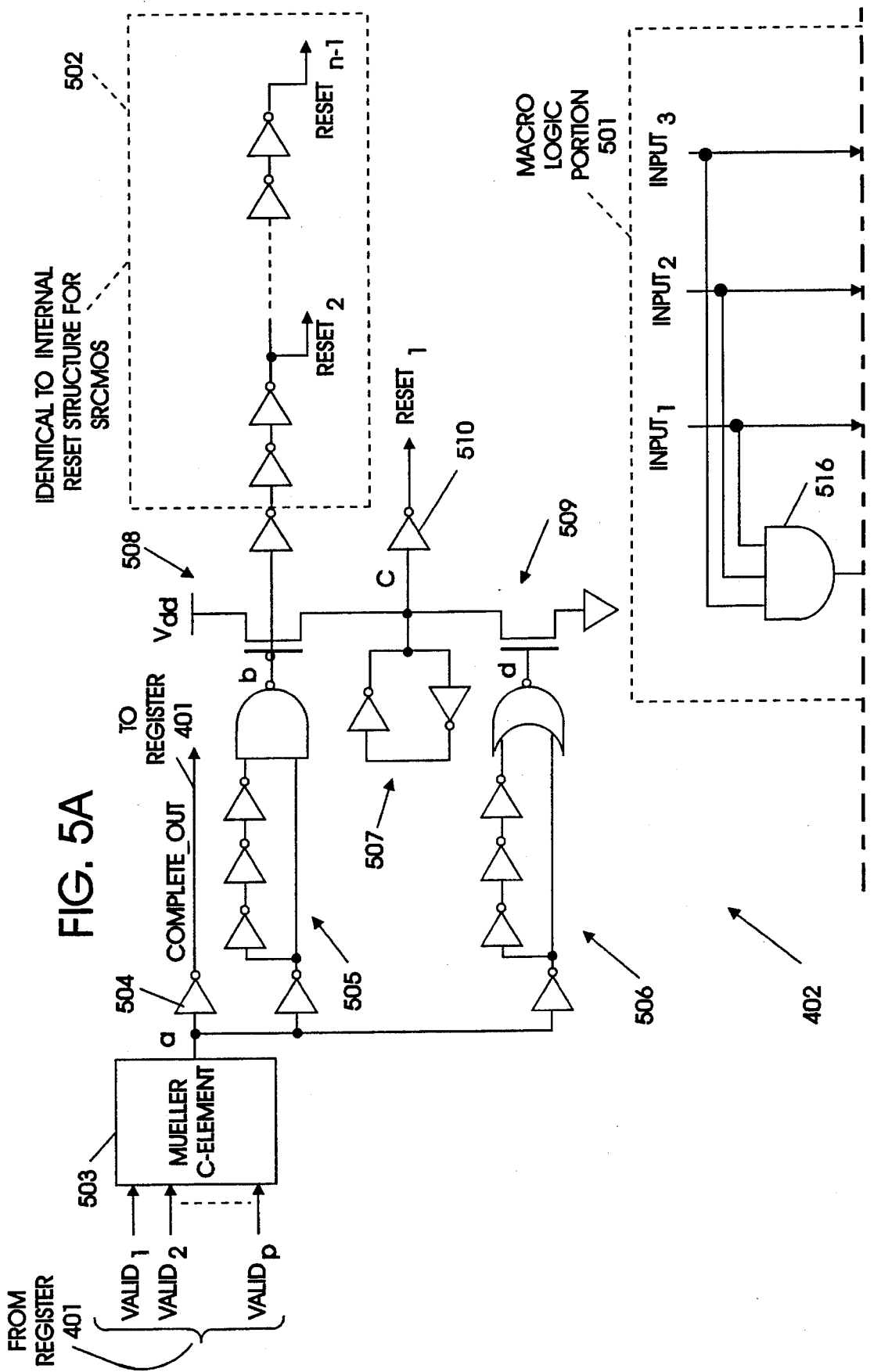
FIGS. 5, 5A, and 5B illustrate a more detailed diagram of one of the macros illustrated in FIG. 4.
Figures 5, 5B:
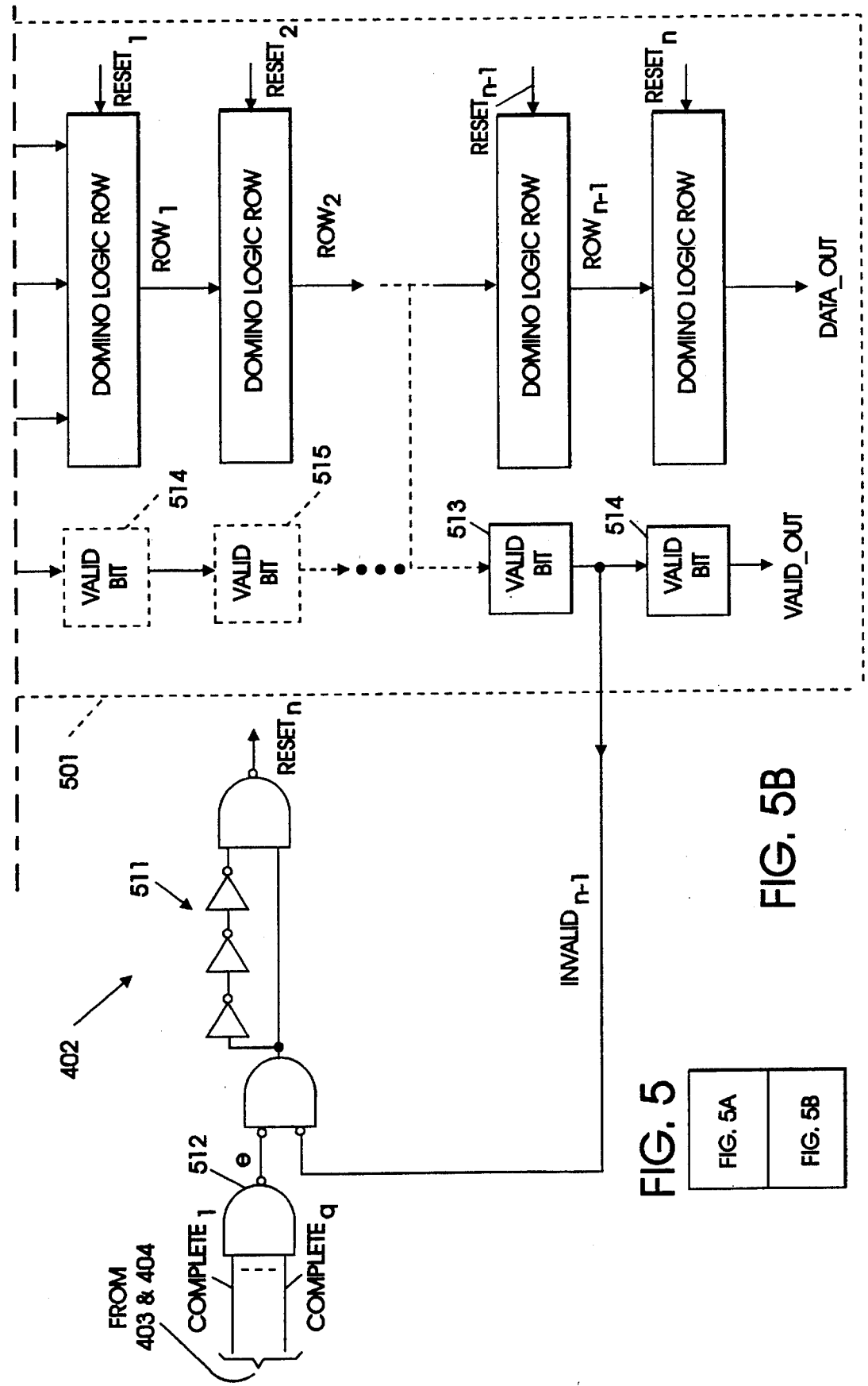

Referring next to FIG. 5, there is illustrated a more detailed diagram of macro 402 (or, macro 107 modified in accordance with the present invention). Macro logic portion 501 illustrates for purposes of explanation here receiving $input_1$, $input_2$ and $input_3$ into the first row of domino logic. Outputted from the nth row of domino logic is the data output of macro 402: DATA_OUT. This data output will be supplied to either or both circuits 403 and 404.

Each macro produces a valid bit 513 in conjunction with the n-1 domino logic row, and valid bit 514 in conjunction with the nth domino logic row. The valid bit is a separate bit from the data bits. A valid bit is an always-switching dynamic signal output that follows the data. In other words, the valid bit is launched when the data bits are launched, and the valid bit is reset when the data bits are reset. Such a valid bit could be generated at each of these stages by ORing the complimentary outputs of a domino circuit or by ANDing all valids received at the first stage in a macro received with the inputs from previous source macros, and then passing down these valid bits along with the data being processed through the successive stages of domino logic in logic portion 501. Thus, a valid bit could be produced by AND circuit 516 upon the receipt of all of inputs $input_1$, $input_2$ and $input_3$ and be stored within bit 514, which transfers the valid bit to bit 515 along with the data being transferred from the first row to the second row of domino logic, etc. down through bits 513 and 514. In other words, a valid bit is sent down the domino logic rows (or generated during a row) as just another domino circuit added to the data bus width. That is, the internal bus width increases by a single bit, whether through the entire circuit or just at the next to last row.

Thus, each macro produces a valid signal: VALID_OUT. This valid signal is then delivered along with the DATA_OUT to the next macro receiving that output data.

Within macro 402, the p (wherein p is a positive integer) valid inputs received along with input data $input_1$, $input_2$ and $input_3$ are received by Mueller C-Element circuit 503. In this example, there will be three valid signals ($valid_1$, $valid_2$ and $valid_3$) received with the three input signals. Circuit 503, which is well-known in the art and may be embodied within several embodiments, produces an output according to the following: When all inputs are active, then the output of circuit 503 is low (note, circuit 503 is an inverting C-element circuit). The output of circuit 503 remains low until all inputs return inactive, then the output of circuit 503 goes high. Thus, when all data has been received from the source macros, the active p valid inputs received by circuit 503 will cause circuit 503 to produce a low signal, which is inverted by inverter 504 and outputted as signal COMPLETE_OUT, which is returned to register 401, i.e., this complete signal is returned to all source macros transmitting the input data to macro 402. Utilization of this complete signal will be discussed further below.

The low signal outputted by circuit 503 is also supplied to 1-shot pulse generator circuits 505 and 506. 1-shot circuit 505 will produce one low pulse only when the output of circuit 503 (node a) falls. 1-shot circuit 506 will produce one high pulse only when the output of circuit 503 rises.

The 1-shot low pulse produced at output b of circuit 505 is supplied to reset structure 502, which utilizes various inverters to produce reset pulses $reset_2 \ldots reset_{n-1}$. Circuitry 502 is similar to the internal reset structure of control circuit 201. Essentially, 1-shot circuit 505 in combination with circuit 503 operates as the pulse generator illustrated in control circuit 201.

This 1-shot low pulse from circuit 505 is also supplied to the gate electrode of P-channel FET 508 causing it to turn on and supply voltage Vdd to node c, which is self-latched by circuit 507. The 1-shot high pulse produced by circuit 506 is supplied to the gate electrode of N-channel FET 509, which turns on transistor 509, thus applying the ground potential to node c. The timing of the signals produced at the outputs of circuits 505 and 506 is such that reset pulse $reset_1$, which is produced by inverting the signal at node c with inverter 510, is produced by 1-shot pulse circuit 505 and turned off by 1-shot pulse circuit 506. The timing of this will be further discussed below with respect to FIG. 6.

Thus, the resetting of the first row of domino logic in macro 402 is not performed until all of the input signals have been received. Therefore, the first row of domino logic is not allowed to start reset before it has received all of the input signals and had time to process them.

Reset signal $reset_1$ turns on when all input valid signals $valid_1 \ldots valid_p$ become active (node a falls causing node b to pulse low, which causes FET 508 to turn on, which causes node c to rise and latch, which causes inverter 510 to drop the reset signal $reset_1$). Note that latch element 507 stores the high value on node c and keeps $reset_1$ on (low) regardless of the pulse ending (rising) on node b. Node c will remain high until all input valids are inactive, which means the COMPLETE_OUT signal has allowed the sending macros to reset their outputs. Then, node a rises through circuit 503. Note that when node a rises that 1-shot circuit 505 does not react. However, 1-shot circuit 506 does react and pulses node d high, turning on FET 509, which pulls node c low (it was high) which, in turn, turns signal $reset_1$ off (high) through inverter 510. The net effect of this operation is to hold the first row of macro 402 in precharge until all the inputs are off. This accomplishes a very important function: if reset signal $reset_1$ were allowed to return off (high) prior to the input signals being removed, then the first dynamic logic row would be in evaluate mode with active inputs, which would cause the circuitry to reevaluate, and destroy (1) the precharge and (2) the data integrity of the subsequent operations.

The reset of the last row of macro 402 ($reset_n$) waits until the next to the last row output becomes invalid (is reset) and all receiving macros (i.e., 403 and 404) have returned completion signals. This prevents the necessity of an interrupt (foot device) and forces the valid output DATA_OUT to remain active until all receiving macros, or sinks, have returned a completion (meaning they have received and acted upon the dam). Thus, each of circuits 403 and 404 will produce a COMPLETE_OUT signal to return to macro 402, just as macro 402 produces such a COMPLETE_OUT signal and returns it to register 401, as discussed above. The q (wherein q is a positive integer) complete signals from the output sinks are received by NAND circuit 512, which has its output coupled to 1-shot pulse circuit 511. The internal valid signal from valid bit 513 associated with the next to last (n-1) logic row in macro 402 is also coupled to 1-shot pulse circuit 511, which produces a low pulse for resetting the nth logic row with signal $reset_n$.

Figure 6:
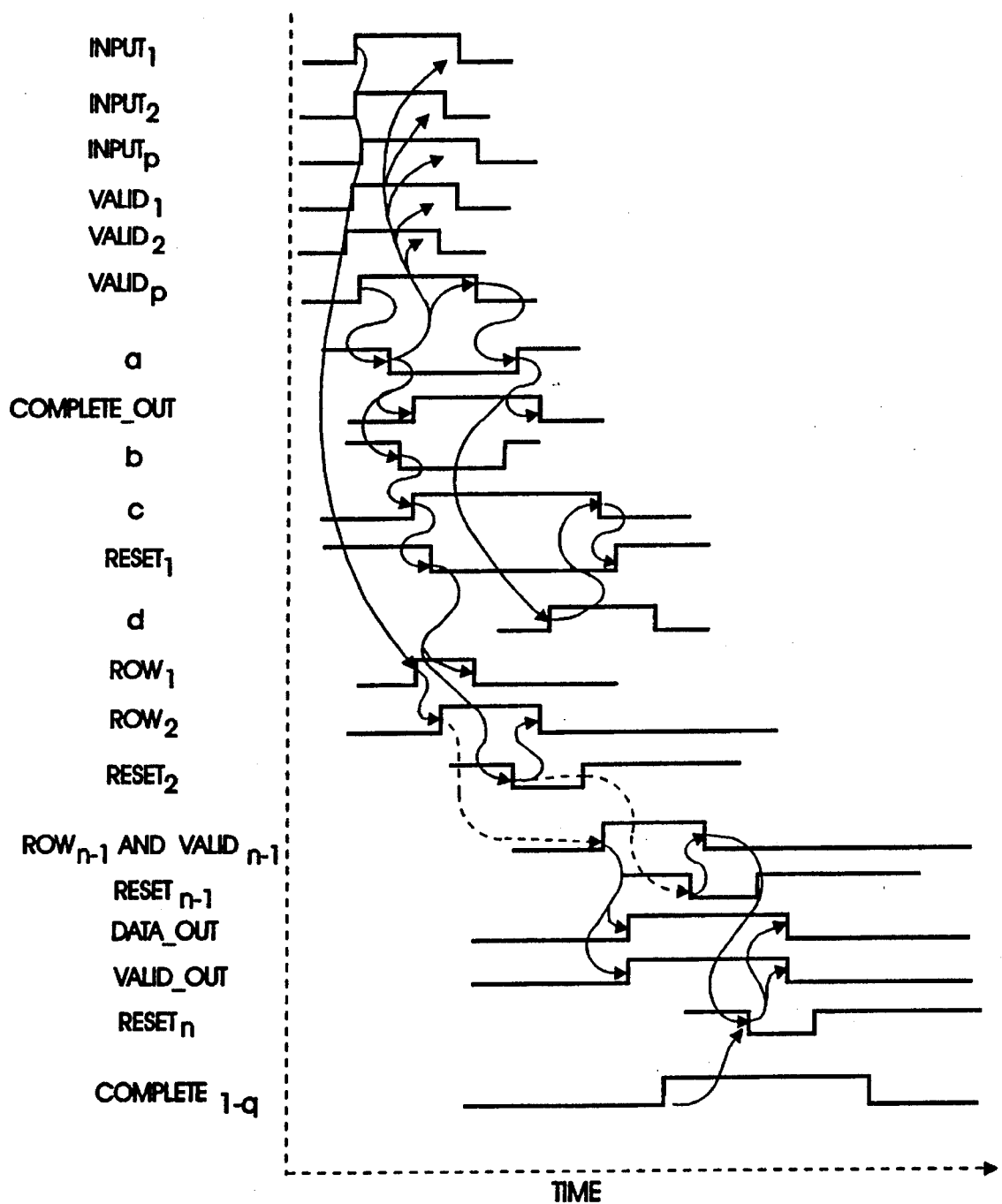
FIG. 6 illustrates a timing diagram of the operation of the macro illustrated in FIG. 5.

Referring next to FIG. 6, there is illustrated a timing diagram of the data flow through macro 402 in accordance with the present invention.

As illustrated, p input data signals ($input_1, input_2 \ldots input_p$) are received by the first row of domino logic in logic portion 501. Note that in this example that the inputs overlap, which would be a result of the present invention. P valid input signals ($valid_1, valid_2 \ldots valid_p$), corresponding respectively to each of the p data input signals, track their data input signals and are received by circuit 503. Once all of the p valid signals are received by circuit 503, circuit 503 produces a low signal (circuit 503 is an inverting C-Element circuit) at node a. This signal is inverted by inverter 504 to produce the COMPLETE_OUT signal, which is returned to register 401. The falling edge of the signal produced at node a also produces the 1-shot low pulse produced by circuit 505 at node b. The falling edge of this low pulse at node b produces the rising edge of the pulse produced at node c, which correspondingly produces the falling edge of the low pulse outputted at the reset signal $reset_1$.

The p data input signals are operated on by the first row of domino logic resulting in output of data signal $row_1$, which is inputted to the second row of domino logic, which outputs $row_2$ as the result of the receipt of $row_1$. The output signal $row_1$ is kept on until the receipt of reset signal $reset_1$. The reset signals of stages 2 through n-1 do not operate independently of reset signal $reset_1$. Rather, note that the start of each subsequent signal is locked to the start of $reset_1$. Note that when the output of circuit 505 drops (node b), this causes node c to rise, which causes $reset_1$ to fall (node c latches and holds this state until node d pulses high, turning on FET 509). However, note that $reset_2$ is a simple delay of node b through four inverters (a delay circuit). Therefore, in parallel to the turning on of $reset_1$ (falling), the delay chain to generate reset signals $reset_2 \ldots reset_{n-1}$ is also started from the same point, node b. Note that the delay to $reset_2$ is designed to mimic the delay through FET 508 and inverter 510 plus the amount of time required for the first domino logic row. Therefore, reset signals $reset_2$ through $reset_{n-1}$ follow the falling edge (active edge) of $reset_1$ and, then, are not independent of it.

The p data input signals will be maintained until all of the source macros have received the COMPLETE_OUT signal from macro 402. Thus, the p valid signals will also be maintained until all of the source macros have received this complete signal. Once all source macros have received the complete signal, they will reset their nth logic stage within their respective macros by resetting that stage, in a manner discussed below, resulting in all of the p valid signals now being turned off. This causes circuit 503 to produce a high signal at node a, which produces a low COMPLETE_OUT signal and causes circuit 506 to produce the 1-shot high pulse at node d. The rising edge of this pulse at node d forces node c to a ground potential, causing reset signal $reset_1$ to turn off.

Data and reset signals will flow through macro logic portion 501 in a typical manner until reaching the n-1 row in macro 402.

As briefly described above, a valid bit could also be transmitted down through the various rows of domino logic, or could be produced at the n-1 logic row. Regardless of the manner of producing this valid bit, once the n-1 domino logic row has received valid data, a corresponding valid bit will be entered within bit (or register bit) 513. This will be outputted as signal $ivalid_{n-1}$, which is received by circuit 511. Note that the signal at bit 513, which may be referred to as signal $valid_{n-1}$ exactly corresponds to data signal $row_{n-1}$, which results in signal DATA_OUT produced by the nth row of domino logic. Signal $valid_{n-1}$ results in signal VALID_OUT produced by valid bit 514. The data output signal DATA_OUT and the valid output signal VALID_OUT correspond identically and are sent to circuits 403 and 404 for their use in a manner as similarly described above.

Reset signal $reset_{n-1}$ resets both $row_{n-1}$ and $valid_{n-1}$.

The q complete signals received from circuits 403 and 404 indicating that they have both received valid data from macro 402 are received by NAND circuit 512. When the n-1 valid signal goes low (this is noted as signal $ivalid_{n-1}$) and all of the q complete signals have been received, signal $reset_n$ is produced by circuit 511. This $reset_n$ signal resets the nth row of domino logic in macro 402 thus turning off the signals DATA_OUT and VALID_OUT. These two signals will be maintained until all receiving macros (in this case circuits 403 and 404) have received these two signals and returned a complete signal ($complete_1$ . . . $complete_q$).

The self-timed version of SRCMOS of the present invention may be implemented within any logic circuitry in a data processing system.

A representative hardware environment for practicing the present invention is depicted in FIG. 7, which illustrates a typical hardware configuration of a workstation in accordance with the subject invention having central processing unit 710, such as a conventional microprocessor, and a number of other units interconnected via system bus 712. The workstation shown in FIG. 7 includes random access memory (RAM) 714, read only memory (ROM) 716, and input/output (I/O) adapter 718 for connecting peripheral devices such as disk units 720 and tape drives 740 to bus 712, user interface adapter 722 for connecting keyboard 724, mouse 726, and/or other user interface devices such as a touch screen device (not shown) to bus 712, communication adapter 734 for connecting the workstation to a data processing network, and display adapter 736 for connecting bus 712 to display device 738.

Although the present invention and its advantages have been described in detail, it should be understood that various changes, substitutions and alterations can be made herein without departing from the spirit and scope of the invention as defined by the appended claims.

What is claimed is:

1. An apparatus comprising:

a first macro operable for outputting a first data signal;

a second macro operable for outputting a second data signal;

a third macro coupled to said first and second macros, said third macro operable for outputting a third data signal in response to receipt of said first and second data signals from said first and second macros, wherein said first, second, and third macros each include a pipeline of self-resetting logic stages, wherein a first stage in said third macro is operable for receiving said first and second data signals, and wherein a last stage of said third macro outputs said third data signal;

circuitry operable for resetting said first stage after said first stage has operated on said first and second data signals; and circuitry, coupled to said resetting circuitry, operable for causing said first and second macros to maintain active said first and second data signals until said third macro has received both said first and second data signals.

2. The apparatus as recited in claim 1, wherein last stages in said first and second macros are operable to output said first and second data signals, and wherein said circuitry operable for causing said first and second macros to maintain active said first and second data signals until said third macro has received both said first and second data signals further comprises:

circuitry operable for sensing receipt in said third macro of said first and second data signals;

circuitry, coupled to said sensing circuitry, operable for signalling said first and second macros that said first and second data signals have been received by said third macro; and circuitry operable for resetting said last stages of said first and second macros in response to receipt of said signalling of said first and second macros that said first and second data signals have been received by said third macro.

3. The apparatus as recited in claim 2, wherein said circuitry operable for resetting said last stage of said first macro in response to receipt of said signalling of said first macro that said first and second data signals have been received by said third macro further comprises:

circuitry operable for sensing when a next to last stage in said first macro has performed a logic operation on first data to produce second data, wherein said second data is inputted to said last stage of said first macro to produce said first data signal, wherein said circuitry operable for resetting said last stage of said first macro in response to receipt of said signalling of said first macro that said first and second data signals have been received by said third macro will not reset said last stage of said first macro until said circuitry operable for sensing when said next to last stage in said first macro has performed said logic operation on first data to produce second data has sensed said logic operation on first data.

4. The apparatus as recited in claim 3, wherein said circuitry operable for sensing receipt in said third macro of said first and second data signals includes a Mueller C-Element circuit operable for receiving first and second valid signals accompanying said first and second data signals, respectively, and wherein said circuitry, coupled to said sensing circuitry, operable for signalling said first and second macros that said first and second data signals have been received by said third macro sends a complete signal to said first and second macros in response to an output of said Mueller C-Element circuit.

5. The apparatus as recited in claim 4, wherein said circuitry operable for sensing when a next to last stage in said first macro has performed a logic operation on first data to produce second data sends an internal valid signal to said circuitry operable for resetting said last stages of said first and second macros in response to receipt of said signalling of said first and second macros that said first and second data signals have been received by said third macro, wherein said circuitry operable for resetting said last stages of said first and second macros in response to receipt of said signalling of said first and second macros that said first and second data signals have been received by said third macro comprises:

a NAND gate operable for receiving said complete signal;

a NOR gate having one input coupled to an output of said NAND gate and a second input operable for receiving said internal valid signal; and a one-shot pulse generator circuit coupled to an output of said NOR gate, said one-shot pulse generator circuit generating a reset signal for resetting said last stage of said first macro.

6. The apparatus as recited in claim 4, wherein said circuitry operable for resetting said first stage after said first stage has operated on said first and second data signals further comprises:

a one-shot pulse generator circuit coupled to said Mueller C-Element circuit; and a switch coupled to a voltage reference, said switch coupled to said one-shot pulse generator circuit.

7. The apparatus as recited in claim 1, wherein said macros are implemented in CMOS.

8. A processor including logic circuitry, said logic circuitry comprising:

a first macro operable for outputting a first data signal;

a second macro operable for outputting a second data signal;

a third macro coupled to said first and second macros, said third macro operable for outputting a third data signal in response to receipt of said first and second data signals from said first and second macros, wherein said first, second, and third macros each include a pipeline of self-resetting logic stages, wherein a first stage in said third macro is operable for receiving said first and second data signals, and wherein a last stage of said third macro outputs said third data signal;

circuitry operable for resetting said first stage after said first stage has operated on said first and second data signals; and circuitry, coupled to said resetting circuitry, operable for causing said first and second macros to maintain active said first and second data signals until said third macro has received both said first and second data signals, wherein last stages in said first and second macros are operable to output said first and second data signals, and wherein said circuitry operable for causing said first and second macros to maintain active said first and second data signals until said third macro has received both said first and second data signals further comprises:

circuitry operable for sensing receipt in said third macro of said first and second data signals;

circuitry, coupled to said sensing circuitry, operable for signalling said first and second macros that said first and second data signals have been received by said third macro; and circuitry operable for resetting said last stages of said first and second macros in response to receipt of said signalling of said first and second macros that said first and second data signals have been received by said third macro, wherein said circuitry operable for resetting said last stage of said first macro in response to receipt of said signalling of said first macro that said first and second data signals have been received by said third macro further comprises:

circuitry operable for sensing when a next to last stage in said first macro has performed a logic operation on first data to produce second data, wherein said second data is inputted to said last stage of said first macro to produce said first data signal, wherein said circuitry operable for resetting said last stage of said first macro in response to receipt of said signalling of said first macro that said first and second data signals have been received by said third macro will not reset said last stage of said first macro until said circuitry operable for sensing when said next to last stage in said first macro has performed said logic operation on first data to produce second data has sensed said logic operation on first data.

9. The processor as recited in claim 8, further comprising:

circuitry, coupled to said sensing circuitry, operable for resetting second through a next to last stages in said third macro.

* * * * *